United States Patent [19]

Bond et al.

[11] Patent Number: 4,488,298
[45] Date of Patent: Dec. 11, 1984

[54] MULTI-BIT ERROR SCATTERING ARRANGEMENT TO PROVIDE FAULT TOLERANT SEMICONDUCTOR STATIC MEMORIES

[75] Inventors: George L. Bond, Fishkill; Frank P. Cartman, Poughquag; Philip M. Ryan, Hopewell Junction, all of N.Y.

[73] Assignee: International Business Machines Corporation, Armonk, N.Y.

[21] Appl. No.: 388,834

[22] Filed: Jun. 16, 1982

[51] Int. Cl.³ .............................................. G06F 11/10
[52] U.S. Cl. ..................................... 371/11; 365/200; 391/2; 391/38
[58] Field of Search ................ 371/11, 38, 2; 365/200

[56] References Cited

U.S. PATENT DOCUMENTS

| | | | |
|---|---|---|---|
| 3,644,902 | 2/1972 | Beausoleil | 365/200 |
| 3,781,826 | 12/1973 | Beausoleil | 365/200 |
| 3,897,626 | 8/1975 | Beausoleil | 365/200 X |
| 4,074,236 | 2/1978 | Ishida | 365/200 |
| 4,365,318 | 12/1982 | Aichelmann, Jr. et al. | 365/200 |

OTHER PUBLICATIONS

P. M. Ryan, Fault Realignment Through Grouping of Compatible Faulty Memory Chips, IBM Tech. Discl. Bulletin, vol. 26, No. 6, Nov. 1983, pp. 2753-2754.
Beausoleil, Maintenance for Memory with Error Correction, IBM Technical Disclosure Bulletin, vol. 11, No. 12, May 1969, pp. 1692-1693.
C. L. Chin, Fault Dispersion in Computer Memories, IBM Technical Disclosure Bulletin, vol. 25, No. 11A, Apr. 1983, pp. 5836-5838.

Primary Examiner—Charles E. Atkinson
Attorney, Agent, or Firm—Richard E. Cummins; Robert J. Haase

[57] ABSTRACT

A fault alignment exclusion method and apparatus is disclosed which operates to prevent the alignment of two or more defective bit storage locations at an address in a memory array. The disclosed memory comprises a plurality (n×m) of separate memory chips arranged in a matrix of n rows and m columns. Each of the chips contains a large plurality (64K) of individually addressable bit locations. A plurality of data words, each containing m (72) bit positions are transferred from the memory array to a n (16) word m (72) bit position buffer during a memory read operation. Steering logic responsive to control signals is disposed between the memory and the buffer which permits the n chips in each column of the array to be effectively rearranged selectively within the respective columns so that the relationship of any given chip to a position of the 16 storage positions in a corresponding buffer column may be selectively changed by the control signals applied to the steering logic. The control signals are developed based on defect data stored in an error map such that each memory address contains no more than one defective location.

6 Claims, 2 Drawing Figures

MULTI-BIT ERROR SCATTERING ARRANGEMENT TO PROVIDE FAULT TOLERANT SEMICONDUCTOR STATIC MEMORIES

BACKGROUND OF THE INVENTION

Field of Invention

This invention relates in general to fault tolerant semiconductor memory systems and, in particular, to an arrangement which insures that each address of the memory system contains only a number of defective storage locations that is equal to or less than the number of errors that can be corrected by conventional processing of the ECC check character by an associated error correcting system.

CROSS-REFERENCED APPLICATIONS

In copending application Ser. No. 381,266, filed May 24, 1982 and assigned to the assignee of the present invention and entitled Fault Alignment Control System and Circuits, a means of high density address permutation is applied in a multidimensional array for some similar purposes. The means of fault alignment control did not describe the data steering logic of the present application.

Application Ser. No. 388,833, filed concurrently herewith and assigned to the assignee of the present invention, is directed to complement-recomplement and exclusive ORing techniques, for correcting errors and avoiding combinations of mapped faults in the same ECC word, for use with a fault tolerant memory system of the type described in the present invention which insures that previously paired chips that resulted in an uncorrectable error will not be similarly aligned at some future time by the realignment process.

Application Ser. No. 388,830, filed concurrently herewith and assigned to the assignee of the present invention, is directed to a method for storing data in a fault tolerant memory system in which the data portion of the word is stored in either the true or complement form while the check byte portion is always stored in true form to reduce the number of words read from memory that contain more errors than can be corrected by the ECC system.

Application Ser. No. 388,831, filed concurrently herewith and assigned to the assignee of the present invention, is directed to a fault tolerant memory system of the type described in the present invention which includes means for transferring the data from each memory chip associated with the memory column which has been detected as containing a defective bit position to other chips in the same column. The data transfer involves addressing the defect column with the old permute address and reading data to a buffer and writing data from the buffer back to the chips in the same column using a new permute address.

Application Ser. No. 388,832, filed concurrently herewith and assigned to the assignee of the present invention, is directed to an arrangement for maintaining an up-to-date map of defective bit positions in the memory during actual use of the memory in its working environment.

DESCRIPTION OF PRIOR ART

The desirability of large, fast, inexpensive semiconductor memories is well recognized in the data processing art. Large memories, such as 16 megabyte memories, for example, are generally made up of a number of 64K bit chips. In one typical arrangement of a 16 megabyte memory, the 64K bit chips are arranged with 128 chips disposed in four 32-chip arrays on one card, with 18 such cards making up the total system. The system is arranged to provide one bit from each 32-bit array in parallel to form a 72-bit data word which includes an 8-bit ECC check character designed to automatically correct a single bit error in any bit position of the 72-bit word by conventional ECC syndrome processing techniques.

Generally, a 16-word 72-bit buffer is connected between the central processing unit of the data processing system and the memory system.

A store operation involves first loading the 16-word buffers from the CPU and then transferring the 16 words in parallel to memory in response to a store or write memory command. The memory address involves selecting 16 chips in each array and uses 16 bits of the address to select one of 64K storage positions on each of the 16 selected chips.

As is well known, a 64K memory chip does not necessarily have all 64K 1-bit storage positions operative. Since the memory system can tolerate an error in each 72-bit data word that is transferred from memory, considerable cost savings can be achieved by using memory chips which are not necessarily perfect. It is very likely, however, that in the assembly of the various chips into 72 different arrays on 18 separate cards to form the 16 megabyte memory, the placement of the chips with defective storage locations will result in some of the word addresses containing more than one defective bit position. Since, in addition to single bit failures on a chip, complete row and column failures are also possible, resulting in 256 bit storage positions being defective, the chances are that occasionally a memory address will contain more than one defective bit position. When such a situation occurs, the prior art systems suggest various arrangements to avoid the problem. One suggestion in the prior art involves skipping any storage location that would result in an uncorrectable error. While such arrangements are operable and are satisfactory under some conditions, the added processing time and reduction in memory capacity can be a severe disadvantage in most situations. The present invention is directed to an arrangement which avoids skipping a memory address containing more defective bit positions than can be handled by the associated ECC system so that the total memory capacity is not reduced even though imperfect memory chips are utilized in the system.

SUMMARY OF THE INVENTION

In accordance with the present invention, data steering logic is provided in each array channel between the array and the word buffers. The logic is responsive to the contents of a failure alignment exclusion register to effect scattering of defective bit positions among different memory locations to minimize the occurrence of more than one defective bit position at any one address. To further improve the scattering of defective bit positions in the system, it is also provided with address permutation logic for each 32-chip array which functions to substitute one chip having a defective bit position with another predetermined chip in the 32-chip array in response to control signals supplied thereto from the associated data processing system.

It is, therefore, an object of the present invention to provide an improved fault tolerant semiconductor memory for a data processing system.

A further object of the present invention is to provide a fault tolerant semiconductor memory system in which certain defective bit positions of the memory are effectively reassigned to other memory address positions whenever the addressed data would have more errors than can be handled by the error correcting system.

A still further object of the present invention is to provide a mechanism for a fault tolerant memory system for reassigning defective bit positions which involves a multi-word buffer and in which the normal relationship of a bit position in the word buffer to the main memory is selectively changed in accordance with predetermined control signals to affect the reassignment of defective bit positions to different word positions of the buffer.

The foregoing and other objects, features and advantages of the invention will be apparent from the following more particular description of a preferred embodiment of the invention as illustrated in the accompanying drawings.

DESCRIPTION OF THE PREFERRED EMBODIMENT

Figure 1:
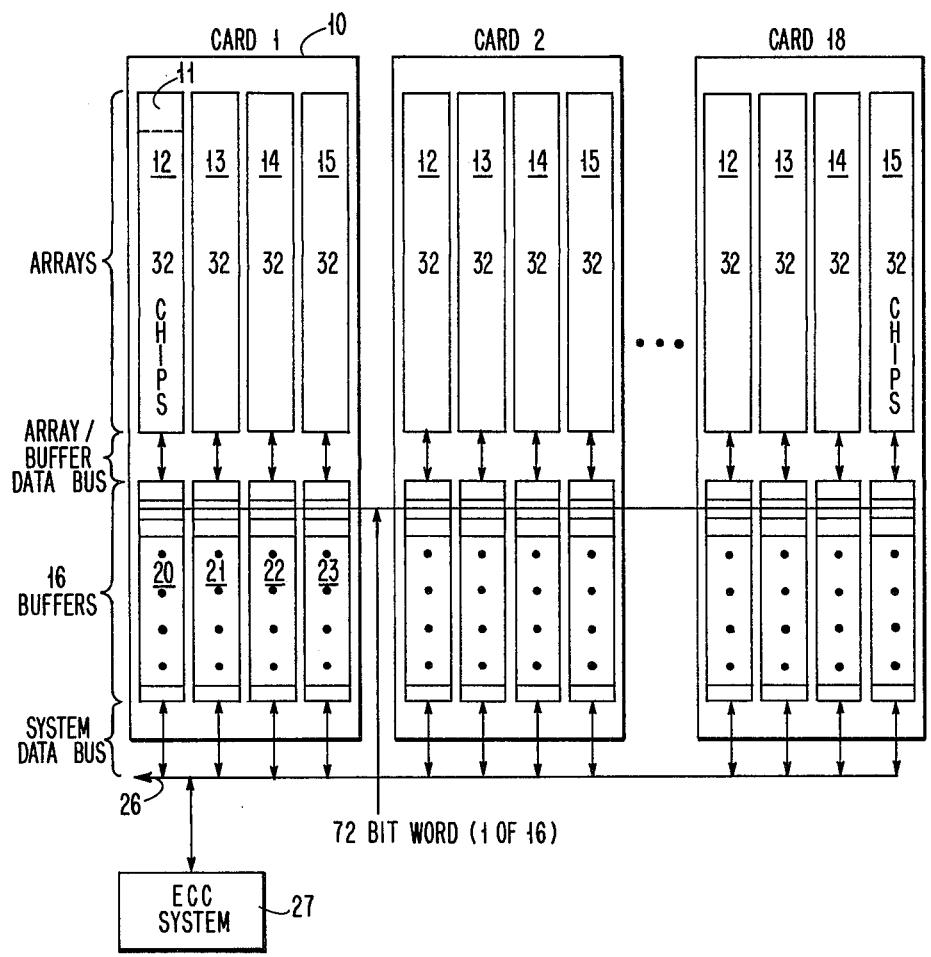
FIG. 1 is a schematic representation of a typical large semiconductor memory system in which the present invention may be advantageously embodied.

The memory system shown schematically in FIG. 1 represents generally a conventional large-scale semiconductor memory, for example, a 16 megabyte memory. The memory, as shown in FIG. 1, comprises 18 separate memory cards 10. Each of the cards are identical in that the cards are populated with 128 separate 64K memory chips 11 which are arranged on the card 10 in a four separate 32-chip arrays 12, 13, 14 and 15. The system is arranged to provide a 72-bit data word so that each of the 72 (4×18) arrays contributes one bit to each data word. The arrays are addressed in parallel, for example, by a 16-bit address, which defines the 1-bit intersection of one of the 256 rows and one of the 256 columns in each of the separate 64K bit chips. The manner in which chips are selected and read out will be discussed later on in the specification.

As shown in FIG. 1, four 16-bit buffers 20-23 are associated respectively with the chip arrays 12-15 on each card. Each buffer 20, 21, 22 and 23 has 16 buffer positions so that 16 72-bit data words are contained in the buffer. The buffer functions as both input and output.

In addition to address signals, each card is also supplied with suitable read, write and control signals along with conventional clock or timing signals (not shown), as is well known in the art.

Figure 2:
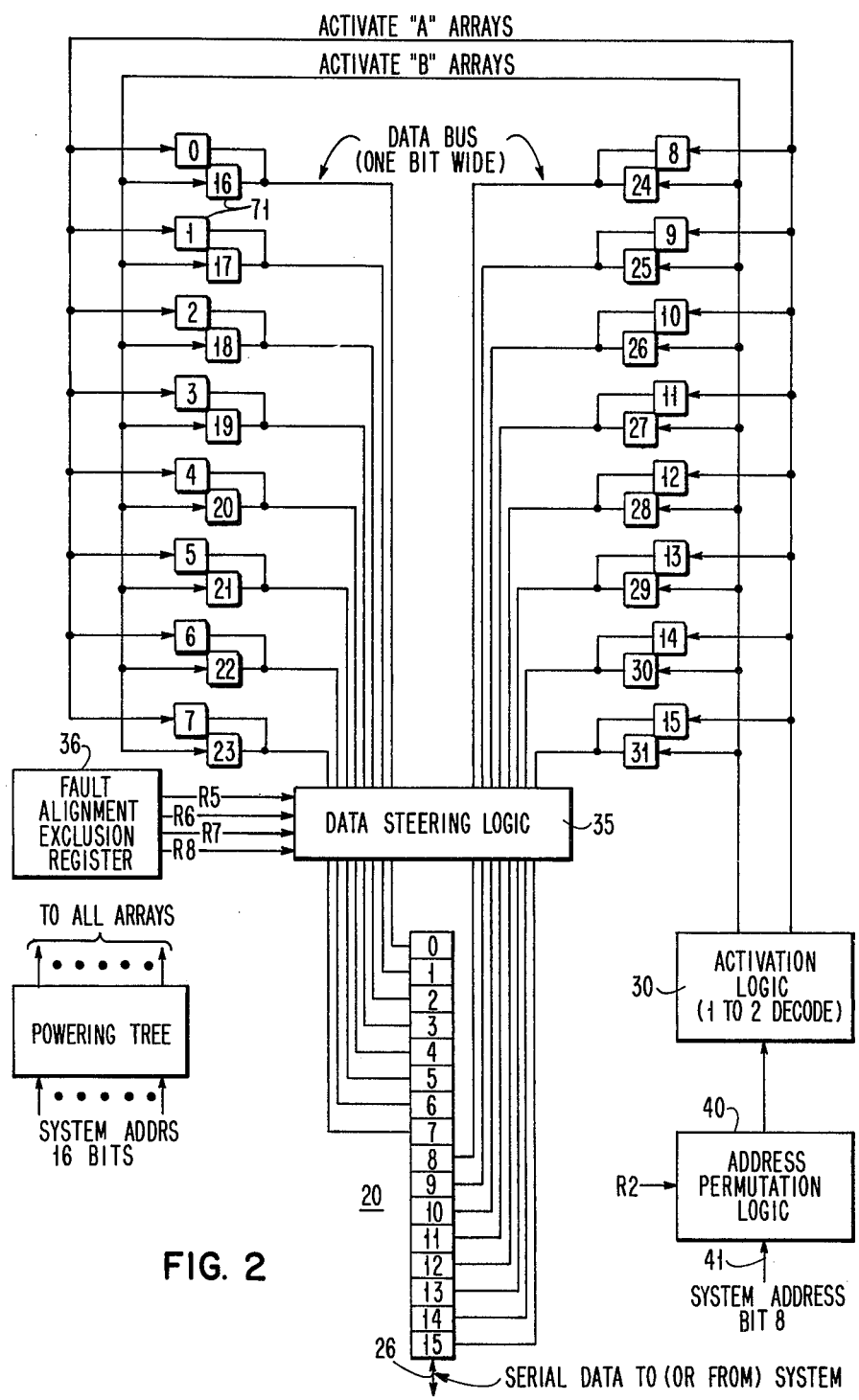
FIG. 2 is a schematic view illustrating the implementation of the present invention to one channel of the memory system shown in FIG. 1.

The memory shown in FIG. 1 is also referred to as having 72 separate channels in that one 32-chip array 12 and its associated 16-bit buffer 20 comprise one channel which is shown in detail in FIG. 2.

The buffer is connected to the system data bus 26 to transfer the 72-bit words to the system either in serial by bit form or in parallel. It is assumed that a suitable error correcting system 27 (ECC) is provided in the overall arrangement to automatically correct, for example, 1-bit errors in any one bit position of a word. The data word, therefore, includes for example a check byte consisting of 8 bit positions.

It will be appreciated by those persons skilled in the art that it is really not economically feasible to provide a 16 megabyte memory in which there are 128×18 error-free 64K bit memory chips which are all perfect and which will remain error-free for the useful life of the memory. The added cost of providing defect-free chips compared to the cost of a simple ECC system for correcting a single bit error has resulted in most memories being provided with an ECC system of reasonable capability and cost. However, as the number of defects permitted in each 64K chip increases, and the capacity of the memory increases, the probability of encountering an address in memory having more than one defective bit position also increases. Rather than eliminate that address from being used by the system, the arrangement shown in FIG. 2 may be employed with considerable advantage in that, with a small addition of some added logic circuitry, previous storage addresses in memory that would have been skipped in accordance with prior art suggestions can now be employed.

FIG. 2 illustrates in detail one channel of the memory shown in FIG. 1 with the additional logic circuitry of the present invention along with additional details of the memory address permutation logic. FIG. 2 shows the individual chips associated with one 32-chip array. As illustrated, the 32 chips are numbered 0-31 and divided into an A array and a B array which, as will be explained in detail later on, are operated at different clock times based on the output of activate logic 30. As shown, the output of one chip 0 and 16 of each array A and B is supplied to stage 0 of the buffer register 20 through data steering logic block 35 which is provided with control signals R5-R8 from a fault alignment exclusion register 36. The general function of logic 35 is to alter the normal relationship of chip 0 for example in the A array and chip 16 in the B array with stage 0 of buffer register 20 so that each of the 32 chips may be selectively connected to each of the 16 stages of buffer 20, depending on the binary pattern of control signals R5 through R8.

The arrangement shown in FIG. 2 also includes address permutation logic 40 which is connected between one address memory line 41 and the activate logic 30 and is supplied with a control signal R2 from the fault alignment exclusion register 36. The function of a permute logic 40 is to effectively change or swap the two associated memory chips in the one channel so that, if a given memory address involves a defective bit position in chip 0, for example, the address permutation logic of the channel can be supplied a control signal R2 which causes the other memory chip 16 to be inserted for chip 0 for that memory address. The objective of steering logic 35 and permutation logic 40 is to limit each memory address to a number of the defective bit locations (1) that is equal to or less than the capability of the ECC system so that an uncorrectable error is never encountered by the overall memory system.

The normal operation of the memory is as follows. The 16 word buffer is connected as shown in FIG. 2. All 18 cards are addressed in parallel with the same 16-bit chip address so that a 72-bit data word is transferred out from each chip in the array to the buffer 20 and then to the system bus 26 at one time in response to a read buffer command. Also, 16 data words may be transferred from the system data bus 26 to the buffer 20 in response to a write buffer command.

Transfers between the buffer and the memory are generally similar in that all chips of the array are provided with the same bit address with 16 bits being read out in parallel from the 16 chips associated with the A array in one clock time and the 16 bits being read out of the chips associated with the B array at some subsequent clock time. With the steering logic in its neutral state, that is, all control signals at binary 0, the output of the chips are supplied to the inputs of the respective stages of the buffer, as shown in FIG. 2 and described above.

As previously mentioned, application of control signals to the steering logic changes the normal relationships that each chip has with its stage of the buffer.

The control signals are supplied from some suitable source, such as another memory associated with the CPU. The control signals are developed prior to storage of data in the memory system by a suitable test program which (1) identifies all defective storage locations in the 16 megabyte memory, and (2) identifies all memory address positions in the memory in which the number of defective bit locations exceeds the corresponding capability of the system error correcting system 26. The identification of (1) and (2) is one of the functions of a conventional ECC system such as represented by the numeral 27 in FIG. 1. Another error mapping scheme is described in copending patent application Ser. No. 345,944, filed on Dec. 17, 1981, and now U.S. Pat. No. 4,456,995 issued June 26, 1984 in the name of Philip Ryan, entitled Apparatus for High Speed Fault Mapping of Large Memories, and assigned to the present assignee. Control signals R5-R8 and R2 are then developed for the steering logic and/or the address permutation logic in accordance with a suitable algorithm that effectively realigns all but one of the defective bit postions at each memory address that has more than one defect to some other address where no defective positions exist. The complexity of the algorithm will, of course, vary depending on the size of the memory, the width of the data word being transferred between the CPU and the memory, and the number and type of errors permitted in each of the 64K memory chips. A suitable method for producing data steering and address permutation control signals is described in the aforecited patent application Ser. No. 388,833.

It will, of course, be appreciated that, as the memory ages and additional defective bit positions develop, additional control signals may be added to those initially provided to do a further realignment of the newly developed defective bit positions. Such a process could be done periodically whenever a number of uncorrectable errors have been detected by the system or there is a desire to have previously skipped address positions put back into productive use.

The mapping of defective bit positions in a large memory is well understood and may be accomplished either at the factory or in the field using known diagnostic procedures.

The details of a specific fault alignment exclusion algorithm have not been set forth since, as indicated, various levels of sophistication may be employed in the analysis of the error data contained in the map. Where the number of memory addresses containing more than one defective location is small, a simple trial and error test involving swapping the associated chip in the other array for the chip containing the defect may solve the problem. When the number of defects to be tolerated is larger, the simple trial-and-error approach becomes ineffective, and a more sophisticated algorithm is needed to determine the values of R2 and R5-R8 for each channel of chips in the memory. A suitable technique for fault alignment exclusion for moderate numbers of defects is taught in U.S. Pat. No. 3,812,336, issued May 21, 1974 to Douglas C. Bossen et al., entitled Dynamic Address Translation Scheme Using Orthogonal Squares, and assigned to the present assignee. Briefly, logic means are employed to modify each bit of the memory array addressing signals so that non-repetitive combinations of array chips are selected (in succeeding memory read-outs) whenever more than one bit is found to be in error in an accessed data word.

While the invention has been particularly shown and described with reference to a preferred embodiment thereof, it will be understood by those skilled in the art that various other changes in the form and details may be made therein without departing from the spirit and scope of the invention.

Having thus described our invention, what we claim as new and desire to secure by Letters Patent is:

1. A memory system comprising in combination:
   a number of memory chips arranged in a matrix of N rows and M columns, each said chip having K×L individually addressable bit positions;
   K×L×N memory addresses, each of which comprises M bit positions;
   a buffer for storing N words each comprising M bit positions;
   means for connecting the write input and the read output of each said chip in each said column of said memory matrix to one of N buffer storage positions associated with each one of said memory columns;
   a source of changeable control signals; and
   data steering logic means connected to said source and said buffer for changing the connective relationship of said N buffer storage positions associated with each bit position of said buffer relative to the position of said chips in the corresponding memory matrix column in response to said control signals, said control signals causing said relationship of said chips to said N buffer positions to be altered when said control signals are changed.

2. The system recited in claim 1 in which said means for changing said connective relationship is operative to permit a first group of n chips to be actively associated in a data transfer relationship with said buffer in place of a second group of n chips whereby one chip is swapped for another chip.

3. In a memory system comprising a relatively large number of individual memory chips, each of which has a relatively large number of individually addressable bit storage positions some of which are defective and in which said chips are arranged in a matrix of n rows and m columns to provide a plurality of word storage locations, each of which comprises n bit positions, some of which include at least two aligned said defective bit positions and further provided with an error correcting system for correcting a single-bit error in any bit position of a word read from memory and which provides an identification of errors in more than one position that are uncorrectable, an improved method of selectively positioning each said defective bit position within its respective column to prevent more than one of said defective bit positions at any one address of said memory, said method comprising:

transferring a plurality of words from a plurality of known memory addresses in parallel to a plurality of word buffers, each said address being associated with a different row of chips in said memory;

selectively changing the normal relationship between each chip in a selected column of said memory and corresponding bit storage positions of said word buffers to cause one chip having an identified defective storage location which might cause an uncorrectable error for a data word stored at that address to be replaced by another chip which is defect free at that storage position.

4. The method recited in claim 3 in which said step of selectively changing the normal relationship between each chip in a selected column of said memory and corresponding bit storage positions of said word buffers comprises steering the output of each said chip to a selected one of said bit storage positions in said word buffer which is selected in accordance with a previously developed control signal.

5. The method recited in claim 3 in which the step of selectively changing said normal relationship between each chip in a selected column of said memory and corresponding bit storage positions of said word buffers includes the step of selectively activating a first group of n cells to establish a data transfer relationship with said buffer memory instead of activating a second group of n cells in a similar data transferring relationship whereby one chip containing a defect is swapped for an associated chip containing no defect.

6. The method recited in claim 4 further characterized by the step of selectively activating a first group of n cells to establish a data transfer relationship with said buffer memory instead of activating a second group of n cells in a similar data transferring relationship whereby one chip containing a defect is swapped for an associated chip containing no defect.

* * * * *